United States Patent [19]

Longmire et al.

[11] Patent Number: 4,510,451
[45] Date of Patent: Apr. 9, 1985

[54] PREFIRE IDENTIFICATION FOR PULSE POWER SYSTEMS

[75] Inventors: Jerry L. Longmire, Los Alamos; Michael E. Thuot, Espanola; David S. Warren, Los Alamos, all of N. Mex.

[73] Assignee: The United States of America as represented by the United States Department of Energy, Washington, D.C.

[21] Appl. No.: 410,787

[22] Filed: Aug. 23, 1982

[51] Int. Cl.³ .................... G01R 29/02; H03K 5/26
[52] U.S. Cl. .................. 328/130.1; 307/234; 307/265; 328/60; 328/112; 368/118; 455/610; 455/617
[58] Field of Search ............ 307/234, 260, 265; 328/59, 60, 111, 112, 129.1, 130.1; 455/609, 610, 612, 613, 617; 368/113, 118, 119-121

[56] References Cited

U.S. PATENT DOCUMENTS

| | | | |
|---|---|---|---|
| 4,070,572 | 1/1978 | Summerhayes | 455/612 X |
| 4,095,125 | 6/1978 | Ingle | 328/112 X |
| 4,107,519 | 8/1978 | Bicek | 455/609 X |
| 4,251,741 | 2/1981 | Gardenghi et al. | 307/260 |
| 4,339,712 | 7/1982 | Walters | 368/118 X |
| 4,347,617 | 8/1982 | Murano et al. | 328/112 X |
| 4,366,435 | 12/1982 | Hyodo | 368/118 X |

OTHER PUBLICATIONS

Longmire et al., "Fiber Optic Analog and Timing Monitoring System for the Antares Laser Fusion Program", SPIE vol. 296, (1981), pp. 219–222.

Riepe et al., "300-kJ, 200-kA Marx Module for Antares", 2nd IEEE Int'l Pulsed Power Conf., Lubbock, TX (Jun. 12–14 1979), Digest of Papers, pp. 254–260.

Conte et al., "TRIDENT-A Megavolt Pulse Generator Using Inductive Energy Storage", 2nd IEEE Int'l Pulsed Power Conf., Lubbock, TX (Jun. 12–14 1979), Digest of Papers, pp. 276–283.

Primary Examiner—Stanley D. Miller
Assistant Examiner—David R. Hudspeth
Attorney, Agent, or Firm—Leonard C. Brenner; Paul D. Gaetjens

[57] ABSTRACT

Prefires in a high-power, high-frequency, multi-stage pulse generator are detected by a system having an EMI shielded pulse timing transmitter associated with and tailored to each stage of the pulse generator. Each pulse timing transmitter upon detection of a pulse triggers a laser diode to send an optical signal through a high frequency fiber optic cable to a pulse timing receiver which converts the optical signal to an electrical pulse. The electrical pulses from all pulse timing receivers are fed through an OR circuit to start a time interval measuring device and each electrical pulse is used to stop an individual channel in the measuring device thereby recording the firing sequence of the multi-stage pulse generator.

10 Claims, 6 Drawing Figures

PREFIRE IDENTIFICATION FOR PULSE POWER SYSTEMS

This invention is the result of a contract with the Department of Energy (Contract No. W-7405-ENG-36).

BACKGROUND OF THE INVENTION

The subject invention relates generally to the monitoring and verification of firing sequence in multistage pulse power systems and more particularly to such monitoring and verification in the highly contaminated electromagnetic interference environment generated by large, high-frequency pulsing systems.

Pulse power systems in research and industrial environments are becoming larger and more complex. As size and voltage increase, the number of triggered stages increases. Many processes, e.g., lasers, accelerators, test pulsers, and fusion development systems, require coordinated or repeated firing of large numbers of pulse power systems. Stages within these pulse power systems and multiple pulse power systems interact with each other through conducted and radiated electromagnetic interference causing the probability of prefire to increase. The large number of gaps and triggering devices in large systems also increases the chance of prefire. Presently, prefires in pulse power systems are located by firing various combinations of trigger stages or combination of pulsers. This is a long and tedious process, since prefires usually do not occur on each operation cycle.

Further complicating prefire location identification in present pulse systems is the fact that the characteristics of the triggering signals may vary greatly. A typical pulse system to be monitored by the present invention may include triggering signals ranging from 4 to 1000 amperes and having pulse widths from nanoseconds to microseconds.

SUMMARY OF THE INVENTION

It is therefore an object of the present invention to provide a low cost and reliable means for identifying prefires in a multistage pulse power system.

It is another object of the present invention to provide pulse monitoring and sequence verification in a severely contaminated electromagnetic interference environment.

It is still yet another object of the present invention to provide pulse monitoring and sequence verification for high powered multistage pulsing systems having pulses widely varying in power and duration.

To achieve the foregoing and other objects, and in accordance with the purposes of the present invention, as embodied and broadly described herein, the apparatus of this invention may comprise a pulse timing transmitter associated with and tailored to each trigger pulse to be monitored, all pulse timing transmitters sending a power controlled pulse of about 100 nanoseconds width through an associated laser diode and fiber optic channel to an individual pulse timing receiver, all pulse timing receivers outputting through an OR gating device to start a time interval monitoring device and each pulse timing receiver outputting directly to the time interval monitoring device to stop interval timing for its associated channel.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and form a part of the specification, illustrate the embodiment(s) of the present invention and, together with the description, serve to explain the principles of the invention. In the drawings.

DETAILED DESCRIPTION OF THE PREFERRED EMBODIMENT OF THE INVENTION

Figure 1:
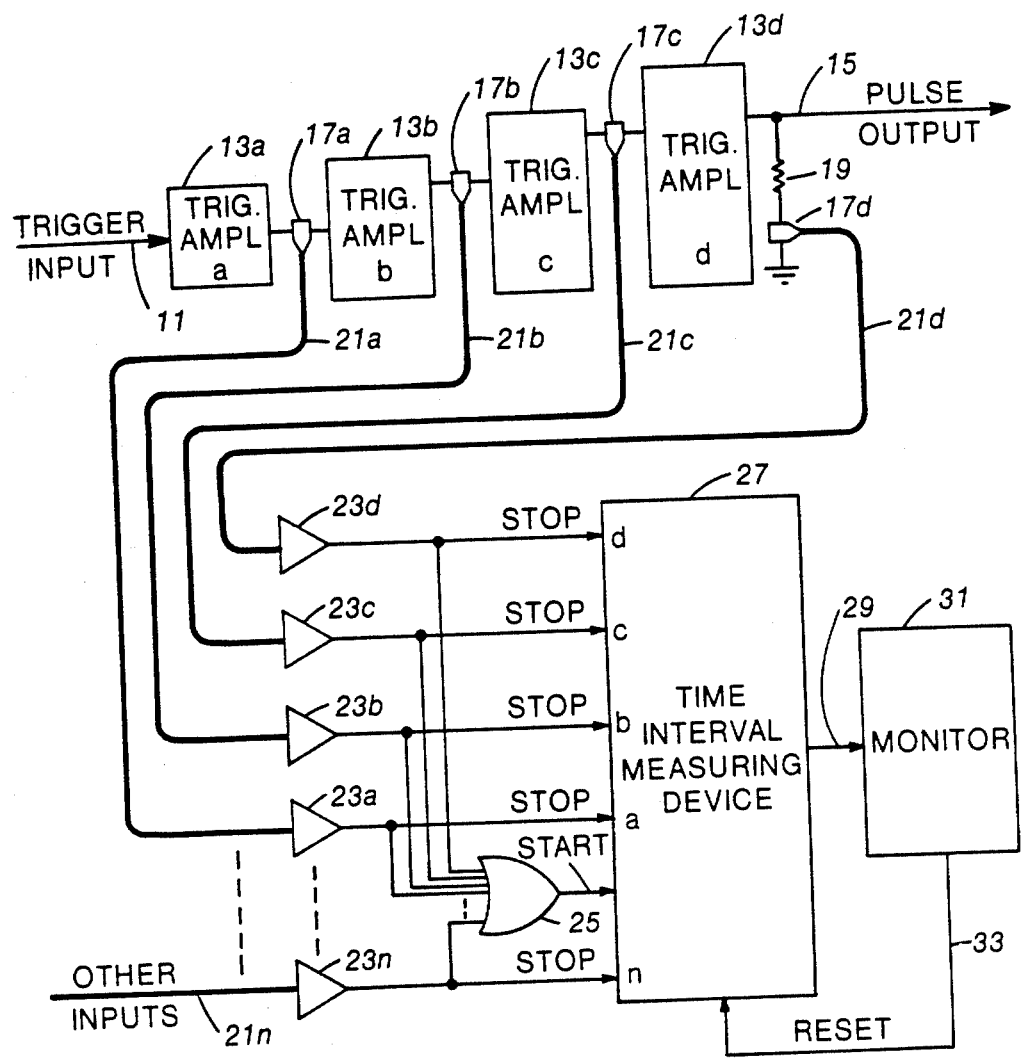
FIG. 1 is a diagram of an embodiment of the present invention for identifying prefires in a pulse power system.

With reference to FIG. 1, the present invention operates in a high-powered series pulse amplifier environment wherein an input trigger pulse is supplied on a trigger input pulse line 11 and is amplified through a series of pulse amplifiers 13a–13d to a pulse output line 15. A series of pulse timing transmitters 17a–17d capable of operating in a severe electromagnetic environment are interposed therebetween.

As will be detailed hereinafter, each pulse timing transmitter 17 shapes its detected pulse, converts it to an optical signal and outputs it to an associated fiber optic cable 21a–21d. Each fiber optic cable 21a–21d extends to an associated optical-to-electrical receiver 23a–23d removed from the hostile electromagnetic environment generated by the pulse amplifiers 13a–13d.

The output of each optical-to-electrical receiver 23a–23d is fed through an OR gate 25 to start a time interval measuring device 27. Also the output of each optical-to-electrical receiver 23a–23d is fed directly to the time interval measuring device 27 to provide a specific time interval stop signal. Thus the time interval measuring device 27 functions as and may be fashioned as a multichannel high-speed interval timer.

The data accumulated in the time interval measuring device is fed through a data link 29 to a monitor 31 which may provide a print-out or read-out or both of the time measured and thereby provide an indication as to whether the proper firing sequence occurred or whether a prefire occurred. If a prefire occurred corrective action can be taken either automatically and on-line or off-line. Further, if required, the monitor 31 provides a reset signal on reset line 33 to the time interval monitoring device 27.

Figure 2:
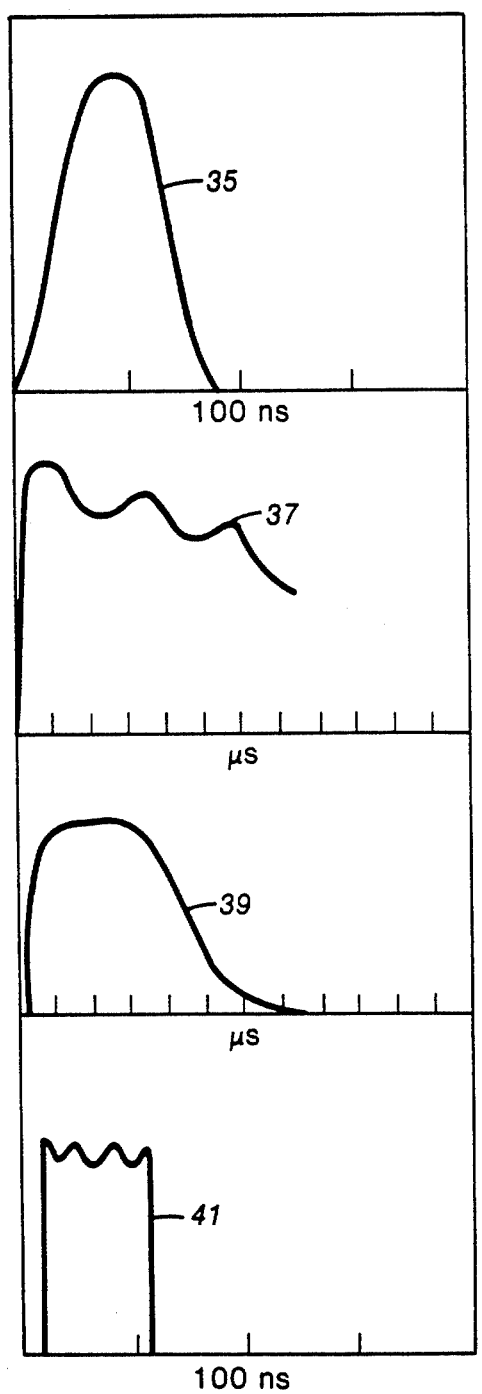
FIG. 2 is a timing diagram illustrating various input pulses to be monitored and an output pulse to be generated by the pulse timing transmitters shown in FIG. 1.

The pulse timing transmitters 17a–17d must be tailored to handle a variety of trigger pulses and yet generate a safe, stable optical signal for the optic cables 21a–21d, see FIG. 2. Typical trigger pulses may vary from 20–1000 amperes with pulse widths of 200 nanoseconds as shown by curve 35, to pulses of 20–600 amperes with pulse widths of up to 10 microseconds as shown by curve 37, to pulses of 4–12 amperes with pulse widths of 100 nanoseconds to 200 microseconds as shown by curve 39. All of these pulses are converted to a stable optical output pulse such as shown by curve 41 which represents a pulse of more than 3 milliwatts having a duration of less than 200 nanoseconds, a rise time of less than 1 nanosecond and jitter of less than 5 nanoseconds.

Figure 3:
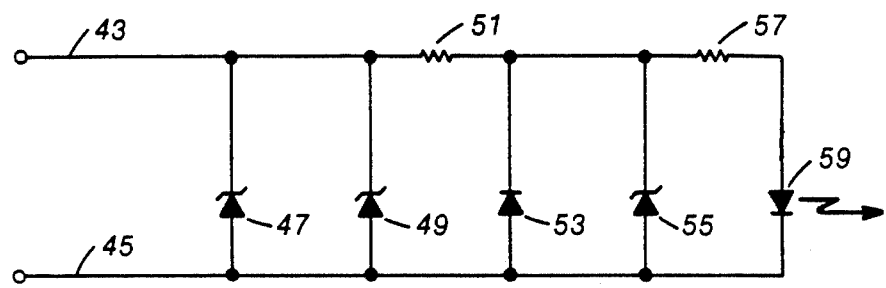
FIG. 3 is a pulse timing transmitter for use in the embodiment of FIG. 1 to monitor trigger pulses of 20 to 1000 amperes having rise times of 0.1 to 50 amperes-per-nanosecond and pulse widths of 200 nanoseconds.

In accord with the invention, each pulse timing transmitter 17 is fashioned as required. For example, to process the 20–1000 ampere pulses shown in FIG. 2, curve 35, and described above, a pulse timing transmitter 17 is employed which corresponds to the schematic of FIG. 3. With reference to FIG. 3, two transient voltage suppressors 47 and 49 are used as fast power zener diodes. The transient suppressors 47 and 49 shunt most of the input current from the laser diode 59 and function as relatively low voltage clamps. Transient voltage suppressor 55 also is a fast power zener diode but with a slightly lower voltage clamp level than transient suppressors 47 and 49. Resistor 51 is a current limiting resistor for transient suppressor 55. Resistor 57 is a current limiting resistor for the laser diode 59. The laser diode 59 is an injection laser diode capable of providing an optical pulse having a subnanosecond rise time. A diode 53 protects the laser diode 59 from reverse overvoltage.

Transient voltage suppressors used for the zener diodes 47 and 49 are available from General Semiconductor Industries, Inc., in their 5KP transient voltage suppressor series having a peak power dissipation rating 5000 watts and clamp voltage levels in the range of 9.4 to 14.4 volts. A similarly available voltage suppressor may be used for zener diode 55 having a peak power dissipation rating of 1500 watts and a clamp voltage level in the range of 7.7 to 12 volts. Resistors 51 and 57 are low inductance resistors in the range of 1 ohm and having suitable power rating. The laser diode 59 is preferrably a gallium arsenide injection laser such as the RCA type SG2000. Unlike a LED which generates a light output whose amplitude is proportional to its input current, the gallium arsenide injection laser has the property of exhibiting a spontaneous light output upon exceeding its current threshold.

Each pulse timing transmitter 17 is preferrably enclosed in a small metal cylinder EMI shielded enclosure (not shown). The shielding should be effective in the EMI environment to prevent observable light output except that caused by signal current through the pulse timing transmitter 17.

Figure 4:
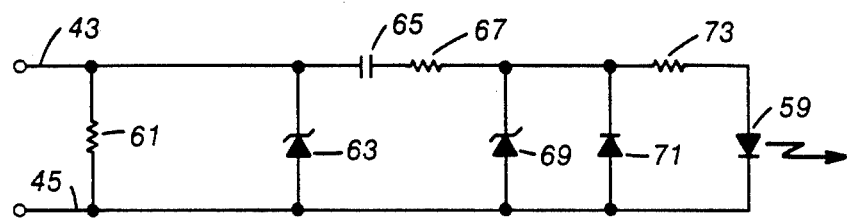
FIG. 4 is a pulse timing transmitter for use in the embodiment of FIG. 1 to monitor trigger pulses of 20 to 600 amperes having input rise times of 0.03 to 1.0 amperes-per-nanosecond and pulse widths of less than 10 microseconds.

To process the 20–600 ampere pulses shown in FIG. 2, curve 37, and described above, a pulse timing transmitter 17 is employed which corresponds to the schematic of FIG. 4. With reference to FIG. 4, a transient voltage suppressor 63 is used as a fast power zener diode. The transient suppressor 63 shunts most of the input current from the laser diode 59 and provides a voltage clamp in the range of 18.9 to 29.3 volts. The transient voltage suppressor 69 also functions as a fast power zener and provides a voltage clamp in the range of 9.5 to 14.5 volts. Resistor 67 and capacitor 65 limit the current of transient suppressor 69. Resistor 67, capacitor 65 and transient suppressor 69 also form a short time constant, differentiator circuit to shorten the voltage pulse developed across transient suppressor 69. Because of the voltage clamping action of transient suppressor 69, a squared pulse shape is generated rather than a differentiated voltage shape. Laser diode 59 is an injection laser diode which provides an optical pulse having a subnanosecond rise time. Resistor 73 is a current limiting resistor for the laser diode 59. A diode 71 protects the laser diode 59 from reverse overvoltage. Resistor 61 is an optional resistor that can be used to raise the operational level of the pulse timing transmitter 17 above the noise levels of the trigger amplifier 13 being monitored. Capacitor 65 may be in the range of 0.047 microfarads at 100 WVDC. The resistors 61, 67, and 73 are low inductance resistors in the range of 1.0 to 2.7 ohms.

Figure 5:
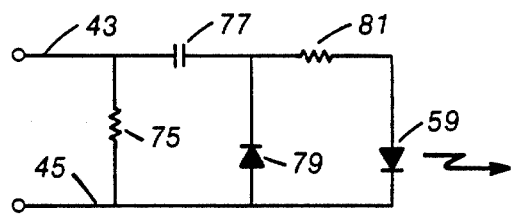
FIG. 5 is a pulse timing transmitter for use in the embodiment of FIG. 1 to monitor trigger pulses of 4 to 12 amperes having input rise times of less than 0.4 amperes-per-nanosecond and pulse widths of 100 nanosecond to 200 microsecond.

To process the 4 to 12 ampere pulses shown in FIG. 2, curve 39, and described above, a pulse timing transmitter 17 is employed which corresponds to the schematic of FIG. 5. With reference to FIG. 5, resistors 75 and 81 and capacitor 77 are used to limit the current pulse to the laser diode 59. Resistor 81 and capacitor 77 also form a short time constant differentiator circuit to limit the time current flows through the laser diode 59. Resistor 75 shunts any excess input current away from laser diode 59. Diode 79 provides a discharge path for capacitor 77 and protects the laser diode 59 from reverse voltage damage. Capacitor 77 may be 0.022 microfarads, resistor 75 can be 8.2 ohms, and resistor 81 can be in the range of 0.5 to 1.0 ohms.

With brief reference again to FIG. 1, each pulse timing transmitter 17 outputs through its laser diode 59 an optical signal of greater than 3 microwatts with rise times in the subnanosecond range. The optical signal thus generated is carried away from the high EMI environment by an optical fiber cable 21. A suitable cable should have an attenuation of less than 40 db/km at 790 nm or 820 nm, with a core diameter of 200 μm. The material numerical aperture should be greater than 0.35. The cable core material is preferrably synthetic silica. A suitable cable is the DuPont PIFAX S-120 type 30 plastic clad silica cable which has aramid members to provide desired strength properties.

Figure 6:
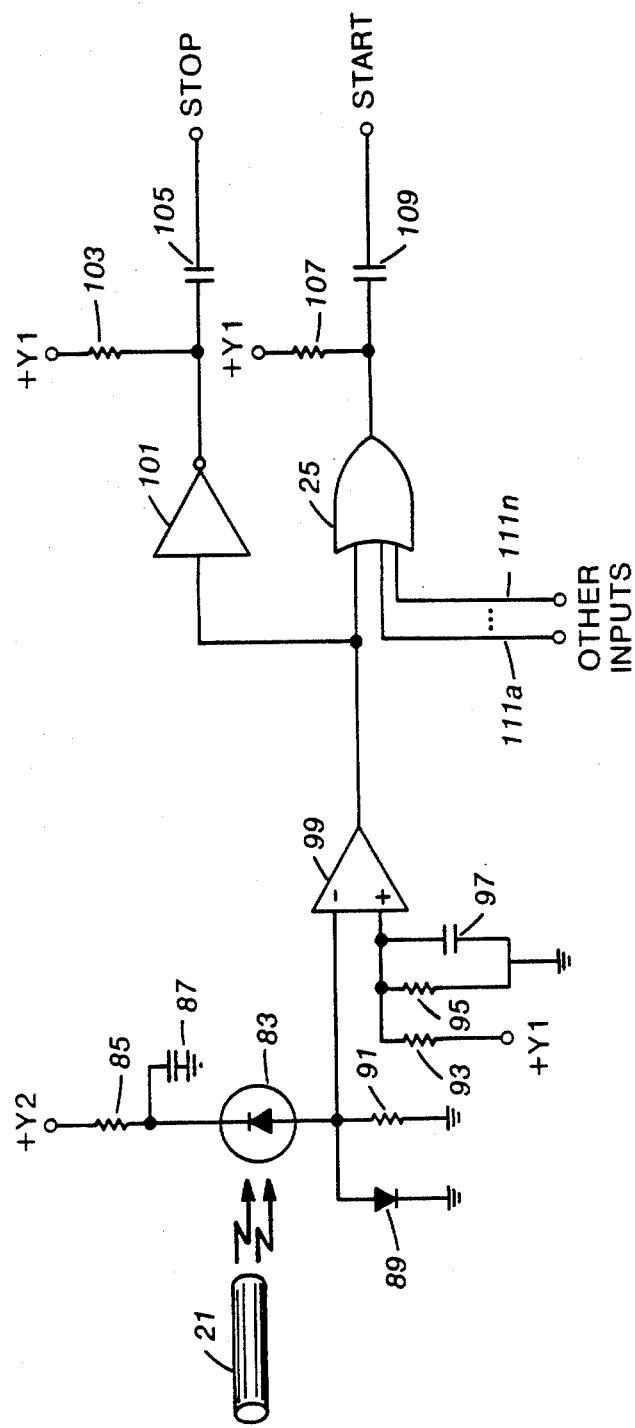
FIG. 6 is a schematic of an optic fiber high-speed timing receiver for use in the present invention to provide an optical-to-electric interface for the time interval measuring device.

Each fiber optical cable 21 emits light into a high-speed timing receiver 23 as represented by FIG. 6, which also shows the OR gate 25, see FIG. 1. With reference again to FIG. 6, light enters an input photodiode detector 83 which is a high speed PIN device. A suitable device for the detector 83 is the RCA PIN photodetector C-30808F.

A signal arriving on the fiber optical cable 21 is applied to the photodiode detector 83. Application of the light signal to the photodiode 83 causes a current to flow through resistor 91 resulting in a signal voltage at the input of differential comparator 99. Schottky diode 89 conducts when positive potentials greater than 0.4 volts are present, thereby protecting comparator 99 from excessively large signals. Resistors 93 and 95 form a voltage divider to produce the required comparator threshold-level signal at the differential reference input of the comparator 99. Capacitor 97 together with resistor 93 form a low pass filter to prevent noise induced changes in the comparator threshold level from occurring. The output of comparator 99 is applied to the inputs of buffer 101 and OR gate 25. Buffer 101 open collector output is pulled up to a positive potential by resistor 103. Output capacitor 105 provides coupling to the STOP input of the time interval measuring device 27, see FIG. 1. When a low asserted signal occurs at the output of buffer 101, it is coupled through capacitor 105. Also, when the output of comparator 99 goes to the asserted signal low, OR gate 25 produces a high-to-low output signal which is applied through capacitor 109 to the START input of the time interval measuring device 27.

The foregoing description of the preferred embodiment(s) of the invention have been presented for purposes of illustration and description. It is not intended to be exhaustive or to limit the invention to the precise form disclosed, and obviously many modifications and variations are possible in light of the above teaching. The embodiment(s) were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A prefire detection system for a high-power, high-frequency, multi-stage pulse generator, said prefire detection system comprising:
    a plurality of pulse timing transmitters, each pulse timing transmitter thereof associated with and tailored to an individual stage of the multi-stage pulse generator, each pulse transmitter for sending an optical signal upon detection of a pulse;
    a plurality of fiber optic cables, each fiber optic cable thereof associated with an individual pulse timing transmitter in said plurality thereof for receiving and transmitting therefrom said optical signal sent upon detection of a pulse;
    a plurality of pulse timing receivers, each pulse timing receiver thereof associated with an individual fiber optic cable in said plurality thereof, each pulse timing receiver for receiving an optical signal transmitted by its associated individual fiber optic cable and for converting each received optical signal into an electrical pulse;
    an OR gate inputted by all pulse timing receivers in said plurality thereof for combining all electrical pulses therefrom;
    a time interval measuring device having a plurality of time interval measuring channels, each time interval measuring channel thereof associated with an individual pulse timing receiver in said plurality thereof for receiving therefrom an electrical pulse for stopping a time interval measurement therewith, said time interval measuring device also associated with said OR gate for starting all time interval measurements with the first electrical pulse combined therein, wherein said time interval measuring device provides an output signal representative of the time interval measurement for each channel.

2. The prefire detection system according to claim 1 wherein each pulse timing transmitter in said plurality thereof includes a laser diode for sending said optical signal upon detection of a pulse.

3. The prefire detection system according to claim 2 wherein said laser diode is a gallium arsenide injection laser diode.

4. The prefire detection system according to claim 1 wherein each fiber optic cable in said plurality thereof is a plastic clad synthetic silica fiber optic cable.

5. The prefire detection system according to claim 1 wherein each pulse timing receiver in said plurality thereof includes a photodiode detector for converting each received optical signal into an electrical pulse.

6. The prefire detection system according to claim 5 wherein said photodiode is a high speed PIN photodetector.

7. The prefire detection system according to claim 1 wherein said plurality of pulse timing transmitters includes a high power pulse timing transmitter for detecting a pulse of 20 to 1000 amperes having a pulse width of 200 nanoseconds and for sending an optical signal of less than 200 nanoseconds having a rise time of less than 1 nanosecond.

8. The prefire detection system according to claim 1 wherein said plurality of pulse timing transmitters includes a medium power pulse timing transmitter for detecting a pulse of 20 to 600 amperes having a pulse width of up to 10 microseconds and for sending an optical signal of less than 200 nanoseconds having a rise time of less than 1 nanosecond.

9. The prefire detection system according to claim 1 wherein said plurality of pulse timing transmitters includes a low power pulse timing transmitter for detecting a pulse of 4 to 12 amperes having a pulse width from 100 nanoseconds to 200 microseconds and for sending an optical signal of less than 200 nanoseconds having a rise time of less than 1 nanosecond.

10. The prefire detection system according to claim 1 wherein said plurality of pulse timing transmitters includes a high power pulse timing transmitter for detecting a pulse of 20 to 1000 amperes having a pulse width of 200 nanoseconds, a medium power pulse timing transmitter for detecting a pulse of 20 to 600 amperes having a pulse width of up to 10 microseconds, a low power pulse timing transmitter for receiving a pulse of 4 to 12 amperes having a pulse width from 100 nanoseconds to 200 microseconds, and wherein said optical signal sent upon detection of a pulse is an optical signal of less than 200 nanoseconds having a rise time of less than 1 nanosecond.

* * * * *